United States Patent
Ikeda (10) Patent No.: US 9,778,311 B2
(45) Date of Patent: Oct. 3, 2017

(54) SEMICONDUCTOR INSPECTION APPARATUS

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/807,335

(22) Filed: Jul. 23, 2015

(65) Prior Publication Data

US 2016/0069946 A1    Mar. 10, 2016

(30) Foreign Application Priority Data

Sep. 5, 2014  (JP) ................................. 2014-181653

(51) Int. Cl.
 *G01R 31/02*    (2006.01)
 *G01R 31/26*    (2014.01)
 *H01L 29/20*    (2006.01)
 *H01L 29/778*   (2006.01)

(52) U.S. Cl.
 CPC ...... *G01R 31/2621* (2013.01); *H01L 29/2003* (2013.01); *H01L 29/7787* (2013.01)

(58) Field of Classification Search
 CPC .............. G01R 31/262; G01R 31/2623; G01R 31/2625; G01R 31/2626; G01R 31/2628
 See application file for complete search history.

(56) References Cited

U.S. PATENT DOCUMENTS

| 4,851,769 A * | 7/1989 | Carpenter et al. ... G01R 31/261 324/110 |
| 5,041,960 A * | 8/1991 | Tseruel ............... H02M 7/5383 363/131 |
| 8,773,031 B2 * | 7/2014 | Sadwick et al. ... H05B 33/0815 315/224 |
| 2007/0013407 A1 | 1/2007 | Okawa |

(Continued)

FOREIGN PATENT DOCUMENTS

| JP | 62-81071 U | 5/1987 |
| JP | 3-293818 A | 12/1991 |

(Continued)

OTHER PUBLICATIONS

Extended European Search Report issued Feb. 15, 2016 in Patent Application No. 15174843.1.

*Primary Examiner* — Tung X Nguyen
(74) *Attorney, Agent, or Firm* — Oblon, McClelland, Maier & Neustadt, L.L.P.

(57) ABSTRACT

The semiconductor inspection apparatus according to an embodiment includes a first detecting unit capable of being electrically connected to a source electrode of a field effect transistor to be evaluated, the first detecting unit used for detecting voltage, a first diode including a first anode electrode and a first cathode electrode, the first cathode electrode capable of being electrically connected to a drain electrode of the field effect transistor, a second detecting unit electrically connected to the first anode electrode, the second detecting unit used for detecting voltage, a first resistance element of which a first end is electrically connected to the first anode electrode, and a first electric power source electrically connected to a second end of the first resistance element.

12 Claims, 12 Drawing Sheets

(56) References Cited

U.S. PATENT DOCUMENTS

| | | | |
|---|---|---|---|
| 2007/0182439 A1 | 8/2007 | Okawa | |
| 2011/0249476 A1 | 10/2011 | Chen et al. | |
| 2013/0234791 A1 | 9/2013 | Ueno et al. | |
| 2013/0265056 A1* | 10/2013 | Lin | G01R 31/44 324/414 |
| 2014/0138704 A1 | 5/2014 | Tanaka et al. | |
| 2014/0139206 A1 | 5/2014 | Hirose | |
| 2014/0327359 A1* | 11/2014 | Masazumi | H01L 27/3204 315/122 |
| 2015/0260760 A1* | 9/2015 | Katakura | G01R 15/04 324/715 |

FOREIGN PATENT DOCUMENTS

| | | |
|---|---|---|
| JP | 5-157714 A | 6/1993 |
| JP | 2011-204877 | 10/2011 |
| JP | 2012-181051 | 9/2012 |
| JP | 2013-15416 | 1/2013 |
| JP | 2014-105999 A | 6/2014 |
| JP | 2014-119379 A | 6/2014 |
| WO | WO 2013/021628 A1 | 2/2013 |

\* cited by examiner

SEMICONDUCTOR INSPECTION APPARATUS

CROSS-REFERENCE TO RELATED APPLICATION

This application is based upon and claims the benefit of priority from Japanese Patent Application No. 2014-181653, filed on Sep. 5, 2014, the entire contents of which are incorporated herein by reference.

FIELD

Embodiments described herein relate generally to a semiconductor inspection apparatus.

BACKGROUND

Group III nitride semiconductor, for example, a gallium nitride (GaN) based semiconductor is expected to be used as a material for next-generation semiconductor devices. The GaN based semiconductor device includes a wider bandgap than that of a silicon (Si) semiconductor device, and thus can achieve a high breakdown voltage and a low loss in comparison to the Si semiconductor device.

A High Electron Mobility Transistor (HEMT) structure using a two-dimensional electron gas (2DEG) as the carrier is widely applied to a field effect transistor using a GaN based semiconductor. Unfortunately, a phenomenon called current collapse occurs in a field effect transistor having such an HEMT structure.

The current collapse is a phenomenon that the application of high drain voltage to a field effect transistor results in increase of on-resistance. To predict the influence of the current collapse on a circuit configured to operate at a high frequency, it is preferable to evaluate the current collapse occurring just after the switching of the field effect transistor.

DETAILED DESCRIPTION

The semiconductor inspection apparatus according to an embodiment includes a first detecting unit capable of being electrically connected to a source electrode of a field effect transistor to be evaluated, the first detecting unit used for detecting voltage; a first diode including a first anode electrode and a first cathode electrode, the first cathode electrode capable of being electrically connected to a drain electrode of the field effect transistor; a second detecting unit electrically connected to the first anode electrode, the second detecting unit used for detecting voltage; a first resistance element of which a first end is electrically connected to the first anode electrode; and a first electric power source electrically connected to a second end of the first resistance element.

The embodiments of the present disclosure will be described with reference to the appended drawings. Note that, in the description below, the same components and the like are denoted with the same reference signs and the descriptions of the components and the like that have been described are appropriately omitted.

Herein, semiconductors including gallium nitride (GaN), aluminum nitride (AlN), indium nitride (InN), and their intermediate compositions are collectively referred to as a "GaN based semiconductor".

First Embodiment

A semiconductor inspection apparatus of the present embodiment includes: a first detecting unit capable of being electrically connected to a source electrode of a field effect transistor to be evaluated, the first detecting unit used for detecting voltage; a first diode including a first anode electrode and a first cathode electrode, the first cathode electrode capable of being electrically connected to a drain electrode of the field effect transistor; a second detecting unit electrically connected to the first anode electrode, the second detecting unit used for detecting voltage; a first resistance element of which a first end is electrically connected to the first anode electrode; and a first electric power source electrically connected to a second end of the first resistance element.

Figure 1:
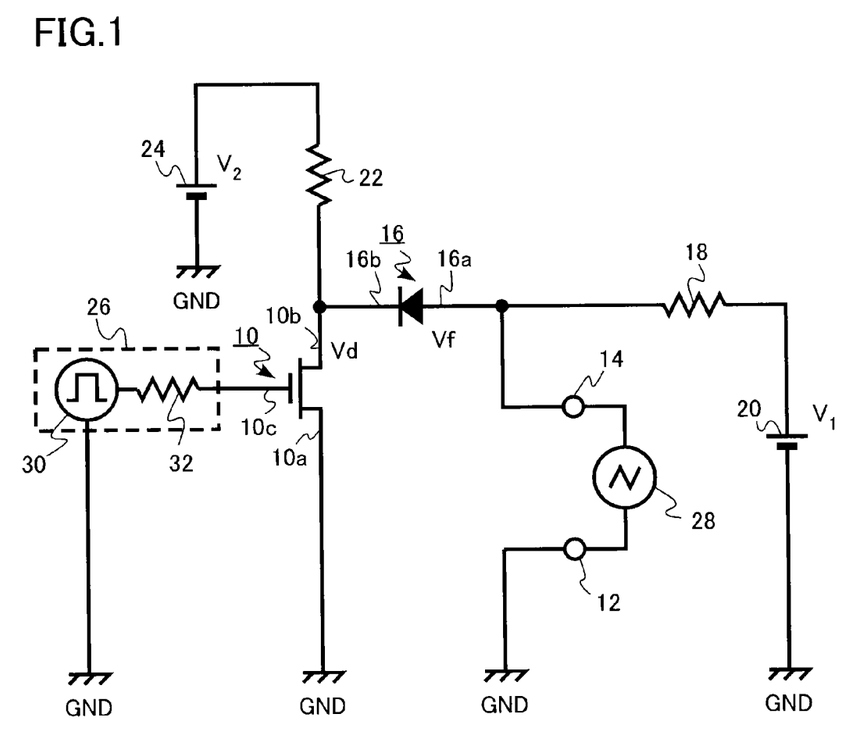
FIG. 1 is a circuit diagram of the semiconductor inspection apparatus according to a first embodiment.

FIG. 1 is a circuit diagram of the semiconductor inspection apparatus according to the present embodiment. The semiconductor inspection apparatus of the present embodiment is configured to inspect an HEMT 10 of a GaN based semiconductor. The HEMT of the GaN based semiconductor is an exemplary field effect transistor. The HEMT 10 includes a source electrode 10a, a drain electrode 10b, and a gate electrode 10c. The semiconductor inspection apparatus according to the present embodiment is configured to evaluate the current collapse in the HEMT 10.

The semiconductor inspection apparatus according to the present embodiment includes a first detecting unit 12, a second detecting unit 14, a first diode 16, a first resistance element (first electric resistance) 18, a first electric power source 20, a second resistance element (second electric resistance) 22, a second electric power source 24, a gate drive circuit 26, and a measuring instrument 28.

The first diode 16 includes a first anode electrode 16a and a first cathode electrode 16b. The first cathode electrode 16b of the first diode 16 is electrically connected to the drain electrode 10b of the HEMT 10. A first end of the first resistance element 18 is electrically connected to the first anode electrode 16a of the first diode 16. A second end of the first resistance element 18 is electrically connected to the first electric power source 20.

The first detecting unit 12 is electrically connected to the source electrode 10a of the HEMT 10. In the present embodiment, the first detecting unit 12 and the source electrode 10a are fixed at ground potentials, respectively. The second detecting unit 14 is electrically connected to the first anode electrode 16a of the first diode 16.

A first end of the second resistance element 22 is electrically connected to the drain electrode 10b of the HEMT 10. A second end of the second resistance element 22 is electrically connected to the second electric power source 24.

The gate drive circuit 26 is electrically connected to the gate electrode 10c of the HEMT 10. The measuring instrument 28 is electrically connected to the first detecting unit 12 and the second detecting unit 14.

The HEMT 10 to be inspected is, for example, formed on a semiconductor wafer and is electrically connected to the semiconductor inspection apparatus through a probe. The HEMT 10 is implemented, for example, in a package and is electrically connected to the semiconductor inspection apparatus through a socket.

The second electric power source 24 is electrically connected to the drain electrode 10b while the second resistance element 22 working as a load is held therebetween. The second electric power source 24 applies a test voltage $V_2$ to the drain electrode 10b. The test voltage $V_2$ is, for example, between 100 and 500 V. The second electric power source 24 is, for example, a power circuit.

The gate drive circuit 26 controls a gate voltage to be applied to the gate electrode 10c of the HEMT 10. The gate drive circuit 26 controls the on and off of the HEMT 10. The gate drive circuit 26 includes, for example, a pulse voltage generation circuit 30 and a resistance element 32. The gate voltage is, for example, 0 V when the HEMT 10 is off, and between 5 and 30 V when the HEMT 10 is on.

When the HEMT 10 is on, a drain current flows due to the drain voltage applied between the source electrode 10a and the drain electrode 10b. Hereinafter, the drain voltage of the HEMT 10 is denoted with Vd and the drain current is denoted with Id.

When the HEMT 10 is off, the drain voltage Vd is a high voltage equivalent to the test voltage $V_2$. The first diode 16 has a function of blocking a high voltage from being applied to the second detecting unit 14 when the HEMT 10 is off. The breakdown voltage of the first diode 16 is higher than the drain voltage Vd applied to the drain electrode 10b of the HEMT 10. In other words, the breakdown voltage of the first diode 16 is higher than the test voltage $V_2$.

Hereinafter, the forward voltage drop is denoted with Vf. The first diode 16 is, for example, a pn diode made of silicon (Si).

The first electric power source 20 has a function of charging the first anode electrode 16a of the first diode 16 when the HEMT 10 is on. The first electric power source 20 is, for example, a power circuit.

The voltage of the first electric power source 20 is lower than the test voltage $V_2$ that the second electric power source 24 applies to the drain electrode 10b. In other words, the test voltage $V_2$ that the second electric power source 24 applies to the drain electrode 10b is higher than the voltage of the first electric power source 20.

The setting for the voltage of the first electric power source 20 is configured to be a higher voltage than the drain voltage Vd when the HEMT 10 is on. Hereinafter, the voltage of the first electric power source 20 is denoted with $V_1$. The voltage $V_1$ of the first electric power source 20 is, for example, between 5 and 30 V.

When the first diode 16 is charged while the HEMT 10 is on, the first resistance element 18 determines the current that flows from the first electric power source 20 to the first diode 16. A relationship of $R_1 \geq 10V_1/Id$ is preferably satisfied when the resistance value of the first resistance element is $R_1$.

The drain voltage Vd of the HEMT 10 may indirectly be measured with the first detecting unit 12 and the second detecting unit 14. Each of the first detecting unit 12 and the second detecting unit 14 is, for example, an electric terminal to which a probe electrically connected to the measuring instrument 28 may be connected.

Note that each of the first detecting unit 12 and the second detecting unit 14 needs only to be a portion at the same potential as that of the source electrode 10a of the HEMT 10 and the first anode electrode 16a of the first diode 16. Each of the first detecting unit 12 and the second detecting unit 14 is not necessarily an independent unit such as an electric terminal. Each of the first detecting unit 12 and the second detecting unit 14 may, for example, be a part of electric wiring.

The measuring instrument 28 has a function of measuring the voltage between the first detecting unit 12 and the second detecting unit 14. The measuring instrument 28 is, for example, an oscilloscope. The measuring instrument 28 is, for example, electrically connected to the first detecting unit 12 and the second detecting unit 14 through a probe. The measuring instrument 28 may directly be connected to the first detecting unit 12 and the second detecting unit 14, for example, by electric wiring.

Next, an inspection method using the semiconductor inspection apparatus according to the present embodiment will be described.

First, the HEMT 10 of the GaN based semiconductor of which current collapse is to be evaluated is prepared. The initial on-resistance of the HEMT 10 before the application of the test voltage is previously and separately found by measurement. Furthermore, a forward voltage drop Vf of the first diode 16 is previously and separately found.

Next, the source electrode 10a, the drain electrode 10b, and the gate electrode 10c of the HEMT 10 are electrically connected to the semiconductor inspection apparatus. The method for connection is not especially limited. A method in which the electrodes are inserted in sockets or a method in which probes have contact with the electrodes may be used according to the aspect of the HEMT 10.

Next, while 0 V is applied to the gate electrode 10c with the gate drive circuit 26 and the HEMT 10 is off, the test voltage $V_2$ is applied to the drain electrode 10b with the second electric power source 24. At that time, the voltage $V_1$ lower than the test voltage $V_2$ is applied to the first anode electrode 16a of the first diode 16 with the first electric power source 20.

Next, a positive voltage is applied to the gate electrode 10c with the gate drive circuit 26 and the HEMT 10 is switched to on. Furthermore, the HEMT 10 may continuously be switched to repeat on and off.

When the HEMT 10 is switched, the voltage between the first detecting unit 12 and the second detecting unit 14 is measured with the measuring instrument 28. The voltage between the first detecting unit 12 and the second detecting unit 14 is the sum of the drain voltage Vd and the forward voltage drop Vf of the first diode 16 when the HEMT 10 is on. Thus, taking the difference between the measured voltage and the forward voltage drop Vf can find the drain voltage Vd.

The drain current Id may be found, for example, from the resistance value of the second resistance element 22, and the difference between the test voltage $V_2$ and the drain voltage Vd, with Ohm's law. Alternatively, the drain current Id may directly be measured, for example, by insertion of a sense resistor, or with a current probe.

From the drain voltage Vd the drain current Id when the HEMT 10 is on, the on-resistance of the HEMT 10 after the application of the test voltage $V_2$ may be found. The comparison between the on-resistance after the application of the test voltage $V_2$ and the initial on-resistance may find the increment of the on-resistance due to the current collapse.

Next, the functions and effects of the semiconductor inspection apparatus according to the present embodiment will be described.

Figure 2A:
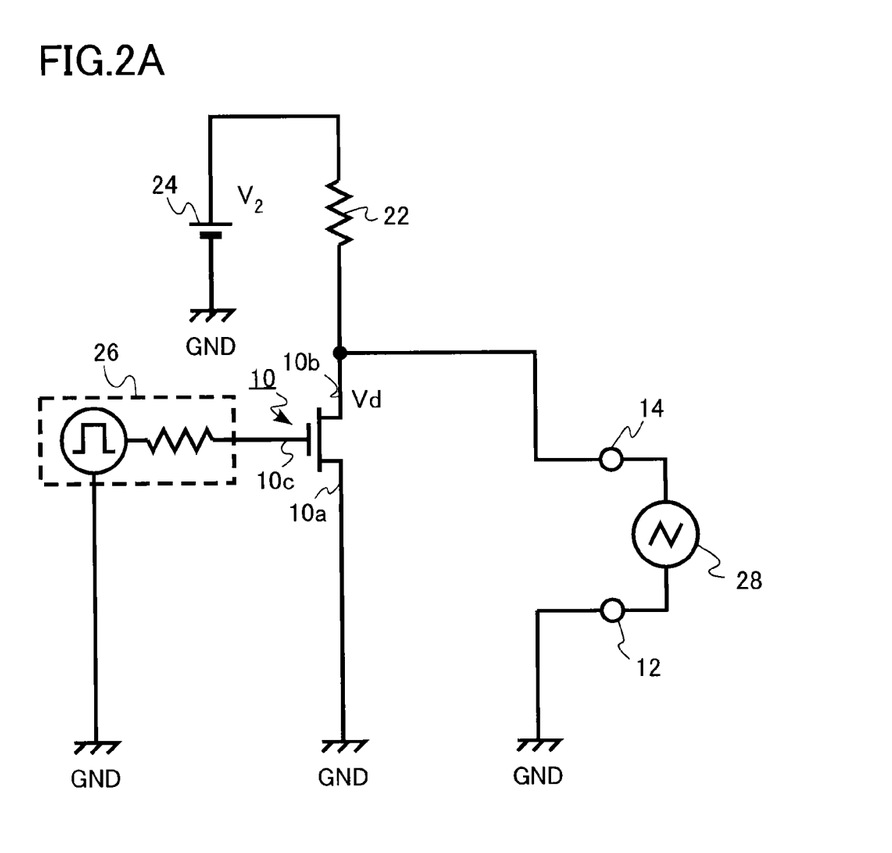
FIGS. 2A and 2B are explanatory diagrams of the semiconductor inspection apparatus according to a first comparative embodiment.
Figure 2B:
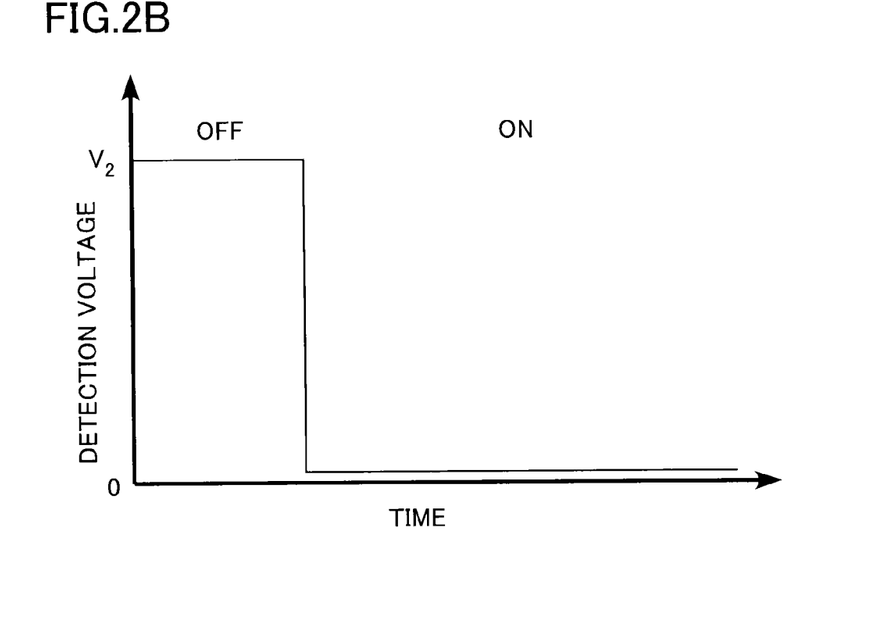

FIGS. 2A and 2B are explanatory diagrams of the semiconductor inspection apparatus according to a first comparative embodiment. FIG. 2A is a circuit diagram, and FIG. 2B is a diagram of the time variation in detection voltage.

Differently from the present first embodiment, the first comparative embodiment does not include a first diode 16, a first resistance element 18, and a first electric power source 20. The first comparative embodiment directly measures the drain voltage Vd by measuring a voltage (detection voltage) between a first detecting unit 12 and a second detecting unit 14.

As illustrated in FIG. 2B, the detection voltage is a high test voltage $V_2$, for example, of hundreds of volts when the HEMT 10 is off. On the other hand, the detection voltage is a low voltage, for example, of several volts as a result from the resistive division of the on-resistance of the HEMT 10 and the second resistance element 22 working as a load when the HEMT 10 is on.

Thus, for example, setting the measurement range of the oscilloscope, which is an example of the measuring instrument 28, at a range appropriate to the test voltage $V_2$ makes it difficult to measure the drain voltage Vd due to the SN ratio and/or the resolution. In contrast, setting the measurement range of the oscilloscope at a range appropriate to the drain voltage Vd when the HEMT 10 is on makes it difficult to measure the drain voltage Vd accurately because of the saturation of the oscilloscope and/or the saturation of the probe connecting the oscilloscope to the first detecting unit 12 and the second detecting unit 14.

Figure 3:
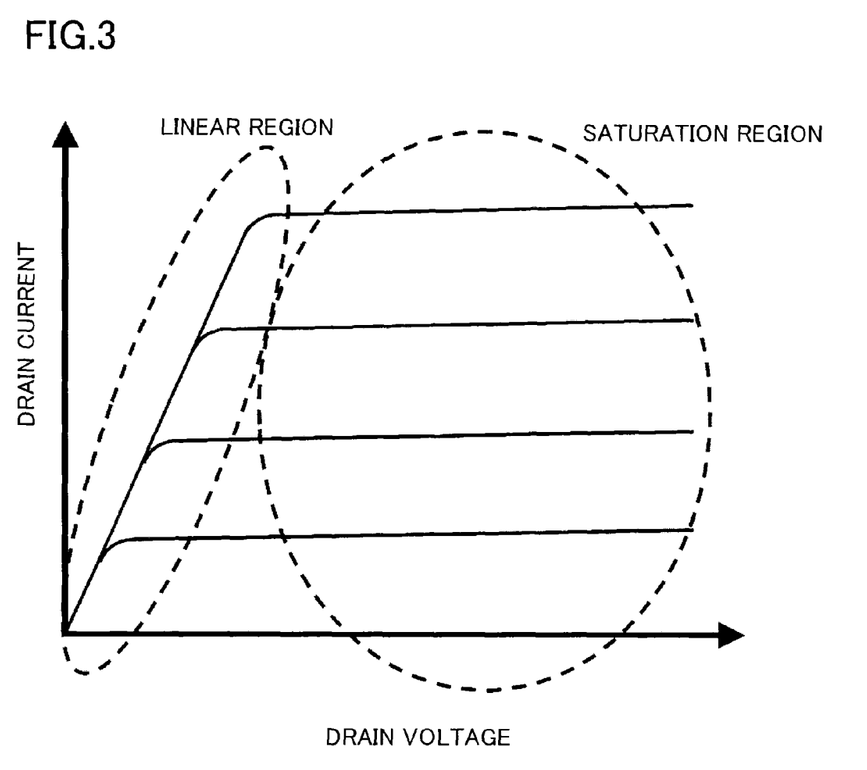
FIG. 3 is a diagram of the characteristics of drain voltage and drain current of a field effect transistor.

FIG. 3 is a diagram of the characteristics of the drain voltage and drain current of a field effect transistor. For example, to evaluate the circuit operation of a power circuit using the field effect transistor as a switching device, the measurement of characteristics of the field effect transistor in a linear region is required.

For example, one method to avoid the problem caused by the SN ratio and/or the resolution in the first comparative embodiment is to set the resistance value of the second resistance element 22 to make the drain voltage Vd high when the HEMT 10 is on. However, such setting causes a problem that the current collapse of the HEMT 10 in the linear region is not evaluated.

Figure 4A:
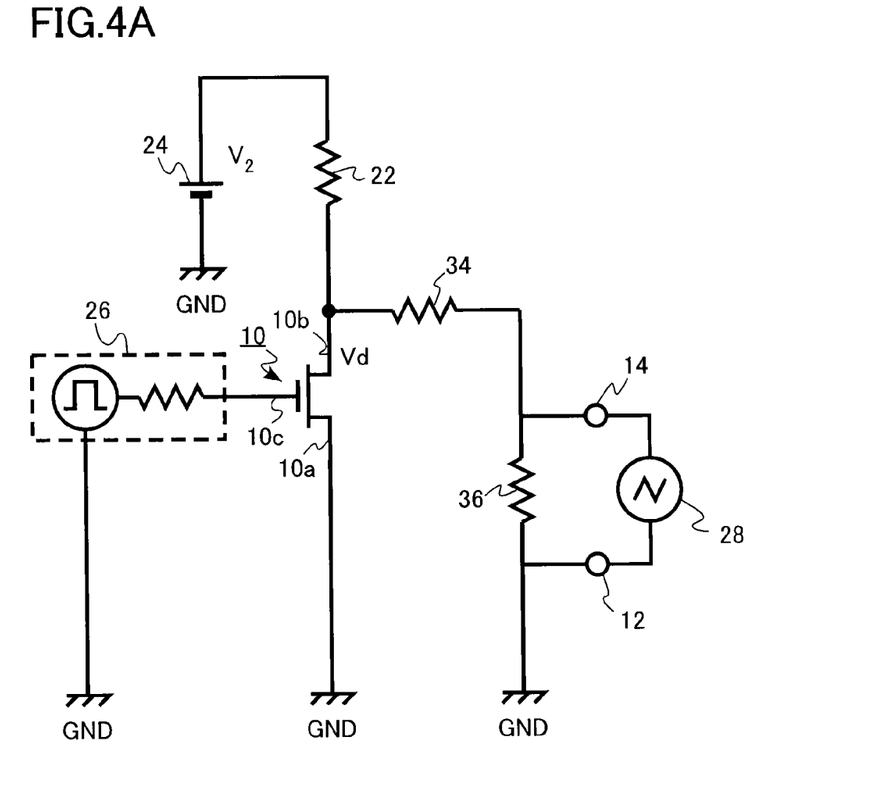
FIGS. 4A and 4B are explanatory diagrams of the semiconductor inspection apparatus according to a second comparative embodiment.
Figure 4B:
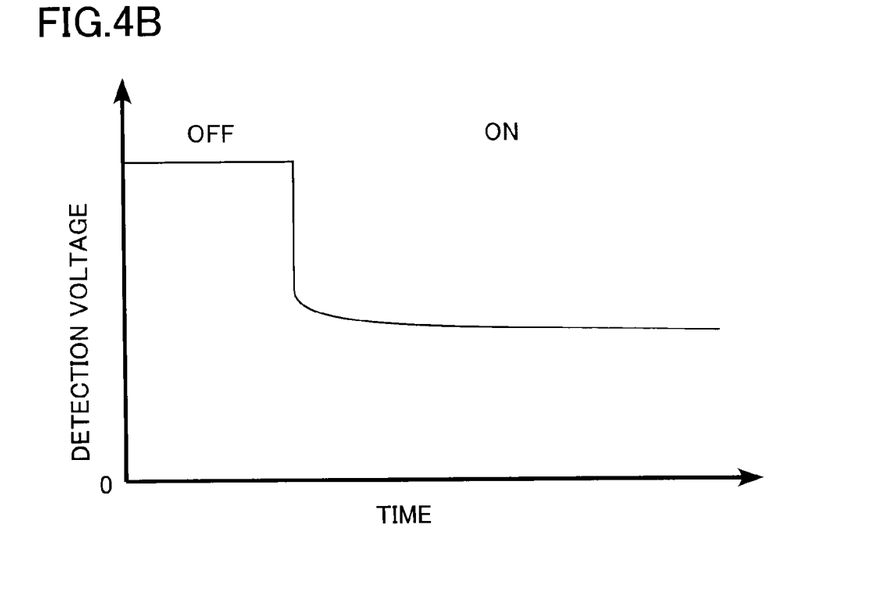

FIGS. 4A and 4B are explanatory diagrams of the semiconductor inspection apparatus according to a second comparative embodiment. FIG. 4A is a circuit diagram, and FIG. 4B is a diagram of the time variation in detection voltage.

The second comparative embodiment is further provided with a resistance element 34 and a resistance element 36 in addition to the first comparative embodiment. Providing the resistance element 34 and resistance element 36 of high-resistance can reduce the detection voltage when the HEMT 10 is off, using the effect of resistive division. This makes it possible to avoid the problem caused by the SN ratio and/or the resolution.

However, when a circuit such as a DC/DC converter of which operation frequency is assumed to be one megahertz or higher is used, it is necessary to detect the current collapse from tens of nanoseconds after the switching of the field effect transistor.

A CR delay due to the resistance element 34 and resistance element 36 of high resistance and/or the parasitic capacitance of the probe occurs in the second comparative embodiment. Thus, the waveform just after the switching of the HEMT 10 from off-state to on-state is rounded off, as illustrated in FIG. 4B. The waveform of the detection voltage when current collapse occurs shows a similar movement. Thus, it may be impossible to distinguish the variation in detection voltage due to the CR delay from the variation in detection voltage due to the current collapse. This makes it difficult to observe and evaluate the current collapse just after the switching.

Figure 5A:
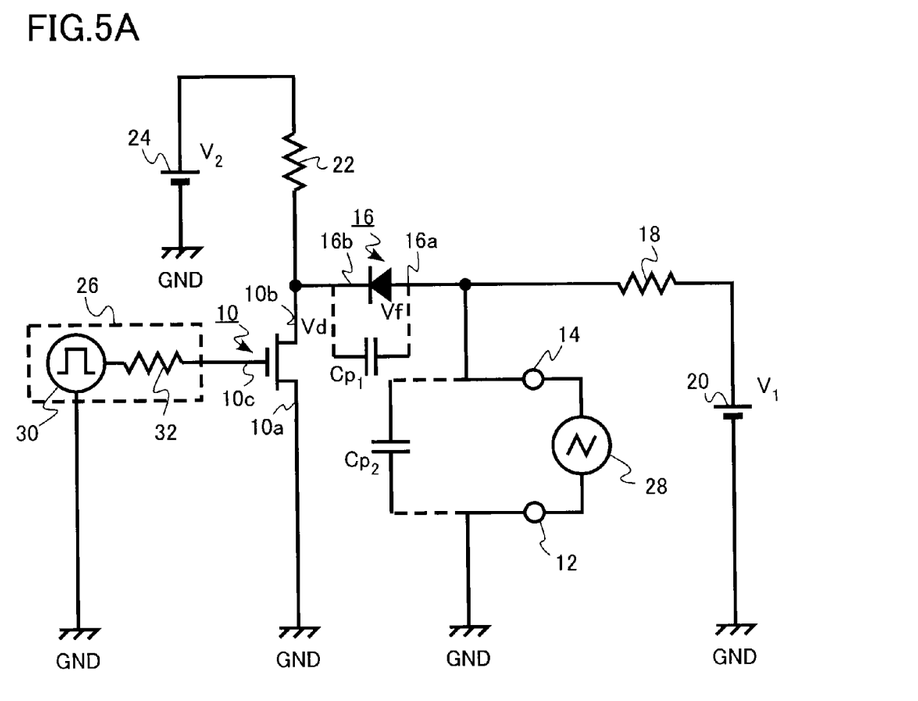
FIGS. 5A and 5B are explanatory diagrams of the function of the semiconductor inspection apparatus according to the first embodiment.
Figure 5B:
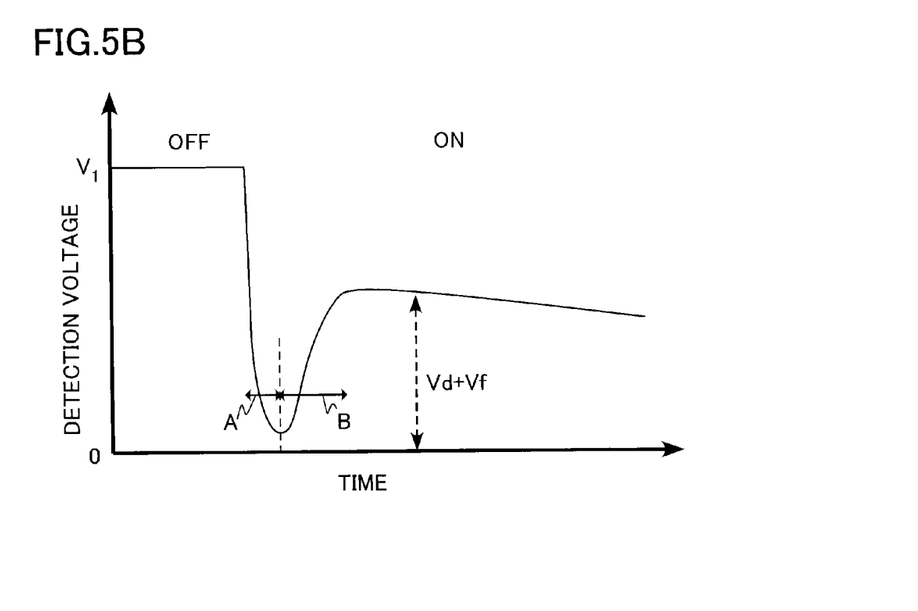

FIGS. 5A and 5B are explanatory diagrams of the function of the semiconductor inspection apparatus according to the present first embodiment. FIG. 5A is a circuit diagram, and FIG. 5B is a diagram of the time variation in detection voltage.

In the present embodiment, the test voltage $V_2$ is blocked by the first diode 16 when the HEMT 10 is off. Thus, the detection voltage when the HEMT 10 is off is the voltage $V_1$ applied by the first electric power source 20. The voltage $V_1$ is set at a lower value than the test voltage $V_2$.

When the HEMT 10 is switched from off-state to on-state, a drain current starts flowing and the drain voltage Vd decreases. This causes charge extraction due to a parasitic capacitance $Cp_1$ of the first diode 16 in a time range A in FIG. 5B and the detection voltage also decreases. Subsequently, a parasitic capacitance $Cp_2$ between the first detecting unit 12 and the second detecting unit 14 is charged from the first electric power source 20 through the first resistance element 18 in a time range B. This increases the detection voltage.

A higher voltage of the second detecting unit 14 than the drain voltage Vd causes a forward current to flow in the first diode 16. The detection voltage in such a state is the sum of the drain voltage Vd and the forward voltage drop Vf of the first diode 16.

According to the semiconductor inspection apparatus of the present embodiment, the detection voltage when the HEMT 10 is off is the voltage $V_1$ lower than the test voltage $V_2$. As a result, the difference of the detection voltages when the HEMT 10 is off-state and on-state decreases. This solves the problem caused by the SN ratio or the resolution. The increase in drain voltage Vd is not required. Thus, the current collapse in the linear region may be observed and evaluated.

Furthermore, the movement of the observed waveform just after the switching of the HEMT 10 can be opposite to the movement when current collapse occurs. This makes it easy to observe the on-resistance just after the switching called dynamic on-resistance. Thus, the current collapse can accurately be evaluated just after the switching.

Furthermore, the parasitic capacitance can be decreased in comparison to the second comparative embodiment. This suppress the CR delay. This also enables the current collapse to be evaluated accurately just after the switching.

Figure 6A:
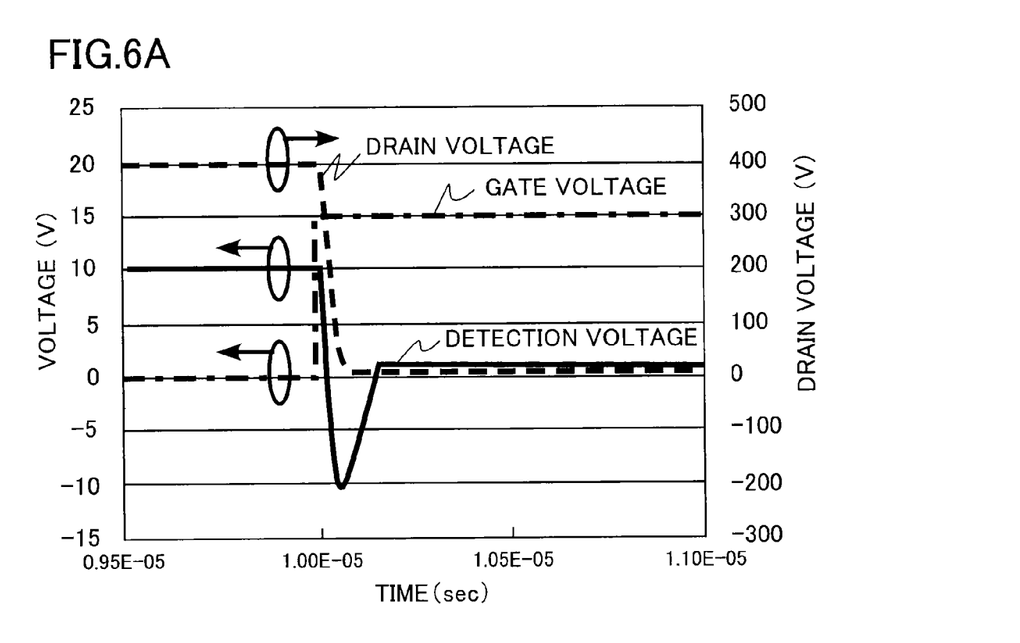
FIGS. 6A and 6B are diagrams of the simulation results of the semiconductor inspection apparatus according to the first embodiment.
Figure 6B:
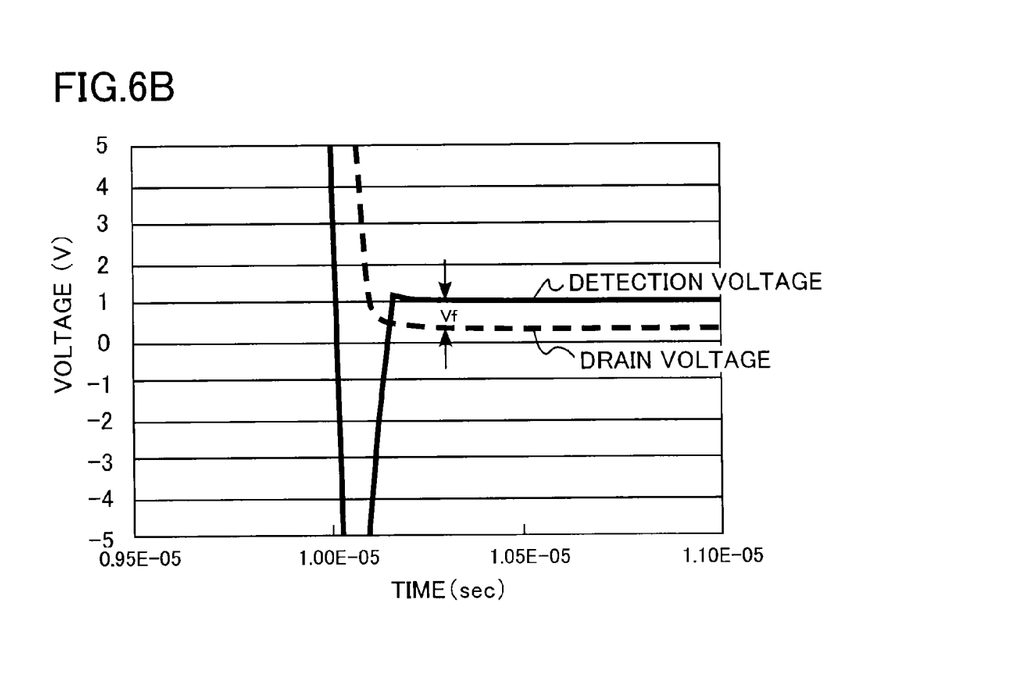

FIGS. 6A and 6B are diagrams of the simulation results of the semiconductor inspection apparatus according to the present embodiment. FIG. 6A illustrates the time variation in each of the gate voltage, the drain voltage, and the detection voltage. FIG. 6B is an enlarged view of a region just after the switching illustrated in FIG. 6A, and illustrates the drain voltage and the detection voltage.

When the gate voltage is zero V while the HEMT 10 is off, the drain voltage Vd is a high voltage (400 V) whereas the detection voltage is maintained at the voltage $V_1$ (10 V) of the first electric power source 20. The gate voltage changes from zero V to a positive voltage (15 V) and the HEMT 10 is on. When the HEMT 10 is on, the detection voltage temporarily drops from zero V and then increases.

When a forward current flows in the first diode 16, the detection voltage is the sum of the drain voltage Vd and the forward voltage drop Vf of the first diode 16, as illustrated in FIG. 6B. In other words, the difference between the detection voltage and the drain voltage Vd is the forward voltage drop Vf.

Figure 7:
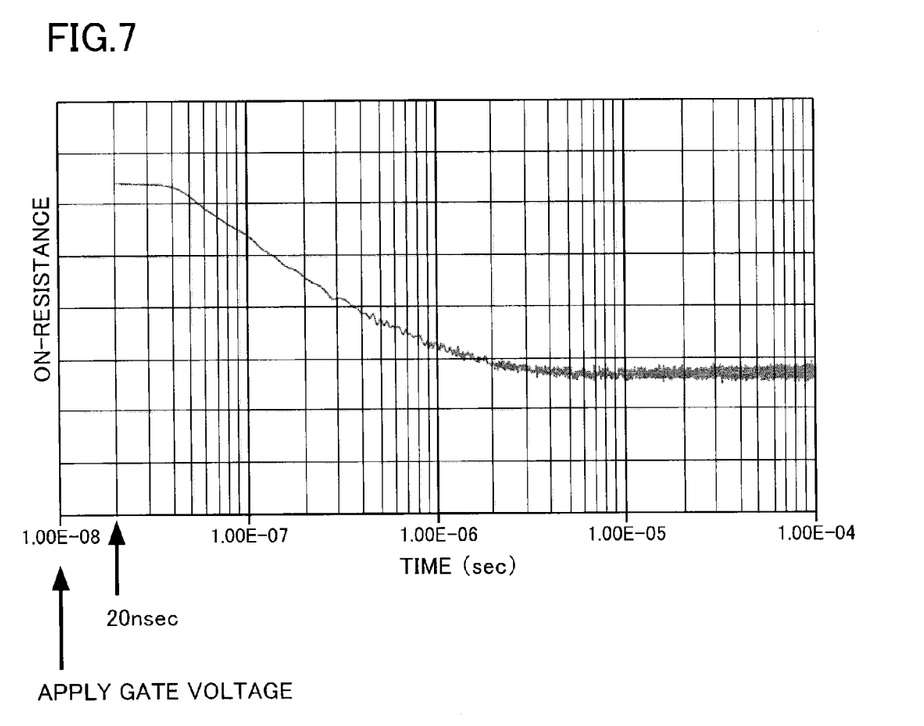
FIG. 7 is a diagram of the measurement results of the on-resistance by the semiconductor inspection apparatus according to the first embodiment.

FIG. 7 is a diagram of the measurement results of the on-resistance by the semiconductor inspection apparatus according to the present embodiment, and illustrates the time variation in on-resistance. The time elapsed after a positive voltage is applied to the gate voltage and the HEMT 10 is switched to on is shown on the horizontal axis.

As illustrated in FIG. 7, the on-resistance can be measured from a short time of 20 nanoseconds after the HEMT 10 is switched.

As described above, the present embodiment can provide a semiconductor inspection apparatus that can evaluate the current collapse from a short period of time after the switching.

Note that a relationship of $R_1 \geq 10V_1/Id$ is preferably satisfied when the drain current of the field effect transistor is Id, the voltage of the first electric power source 20 is $V_1$, and the resistance value of the first resistance element 18 is $R_1$. Satisfying the relationship makes the current flowing from the first diode 16 toward the drain electrode 10b when the HEMT 10 is on equal to or less than a tenth of the drain current Id. This can suppress the influence of the current flowing from the first diode 16 toward the drain electrode 10b on the measurement of the drain voltage Vd. Furthermore, in terms of the reduction in influence, a relationship of $R_1$ $100V_1/Id$ is more preferably satisfied.

Note that the first diode 16 is preferably a fast recovery diode. The fast recovery diode has an excellent recovery characteristic, and thus can accelerate the evaluation especially when the HEMT 10 is continuously switched.

The first diode 16 is also preferably a Schottky barrier diode made of SiC. The Schottky barrier diode made of SiC has an excellent temperature characteristic, and thus improves the accuracy of measurement of a voltage. The Schottky barrier diode made of SiC has also an excellent recovery characteristic, and thus can accelerate the evaluation especially when the HEMT 10 is continuously switched.

An exemplary aspect in which the semiconductor inspection apparatus includes the second resistance element 22, the second electric power source 24, the gate drive circuit 26, and the measuring instrument 28 is described in the present embodiment. Note that, however, the semiconductor inspection apparatus can also include the components outside the inspection apparatus. For example, a semiconductor inspection apparatus configured to evaluate current collapse may include the first detecting unit 12, the second detecting unit 14, the first diode 16, the first resistance element 18, and the first electric power source 20. A transistor evaluation system may include components corresponding to the second resistance element 22, the second electric power source 24, and the gate drive circuit 26. The semiconductor inspection apparatus may be connected to the transistor evaluation system. Additionally, the measuring instrument 28 may be externally connected to the first detecting unit 12 and the second detecting unit 14.

Second Embodiment

The semiconductor inspection apparatus according to the present embodiment is similar to the semiconductor inspection apparatus of the first embodiment except for further including a second diode including a second anode electrode electrically connected to a first detecting unit and a second cathode electrode electrically connected to a second detecting unit. Thus, the descriptions of the contents overlapping with the first embodiment may be omitted.

Figure 8:
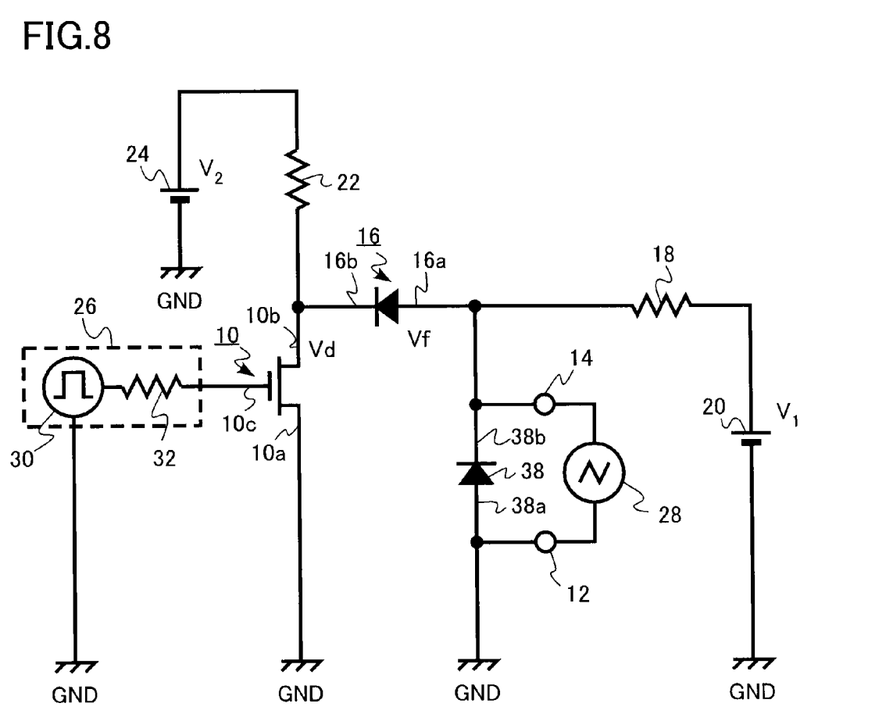
FIG. 8 is a circuit diagram of the semiconductor inspection apparatus according to a second embodiment.

FIG. 8 is a circuit diagram of the semiconductor inspection apparatus according to the present embodiment. The semiconductor inspection apparatus according to the present embodiment includes a second diode 38. The second diode 38 includes a second anode electrode 38a and a second cathode electrode 38b.

The second anode electrode 38a is electrically connected to a first detecting unit 12. The second cathode electrode 38b is electrically connected to a second detecting unit 14. The second diode 38 is, for example, a pn diode.

The second diode 38 prevents the detection voltage from excessively dropping toward a negative value just after an HEMT 10 is switched. This enables the second embodiment to observe and evaluate current collapse from a shorter period of time after the switching.

Figure 9A:
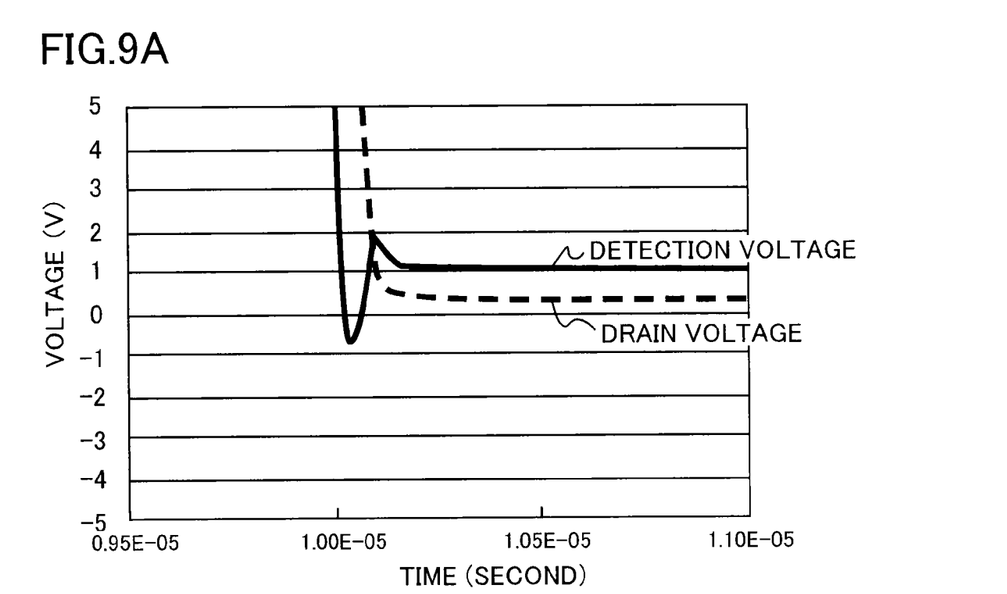
FIGS. 9A and 9B are diagrams of the simulation results of the semiconductor inspection apparatus according to the second embodiment.
Figure 9B:
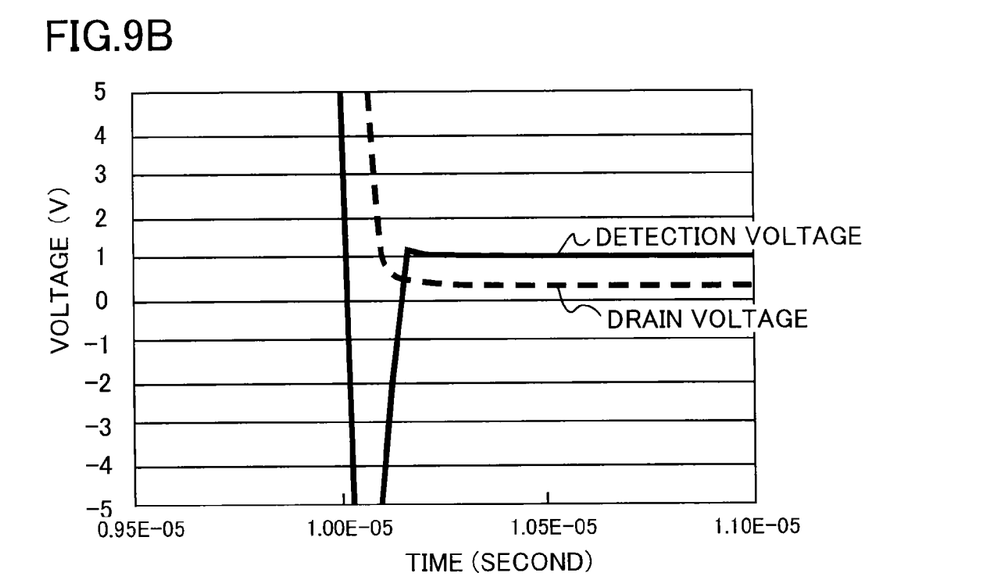

FIGS. 9A and 9B are diagrams of the simulation results of the semiconductor inspection apparatus according to the present embodiment. FIG. 9A illustrates the time variation in each of the drain voltage and the detection voltage of the present embodiment. FIG. 9B illustrates the time variation in each of the drain voltage and the detection voltage of the first embodiment.

As is clear from the comparison between FIGS. 9A and 9B, the drop of the detection voltage toward a negative value just after the switching of the HEMT 10 is suppressed in the present embodiment. As a result, the variation in drain voltage Vd can be observed from a shorter period of time after the switching.

As described above, the present embodiment can provide a semiconductor inspection apparatus that can evaluate the current collapse from a shorter period of time after the switching.

Third Embodiment

The semiconductor inspection apparatus according to the present embodiment is similar to the semiconductor inspection apparatus of the second embodiment except that a second diode is a Zener diode. Thus, the descriptions of the contents overlapping with the second embodiment may be omitted.

Figure 10:
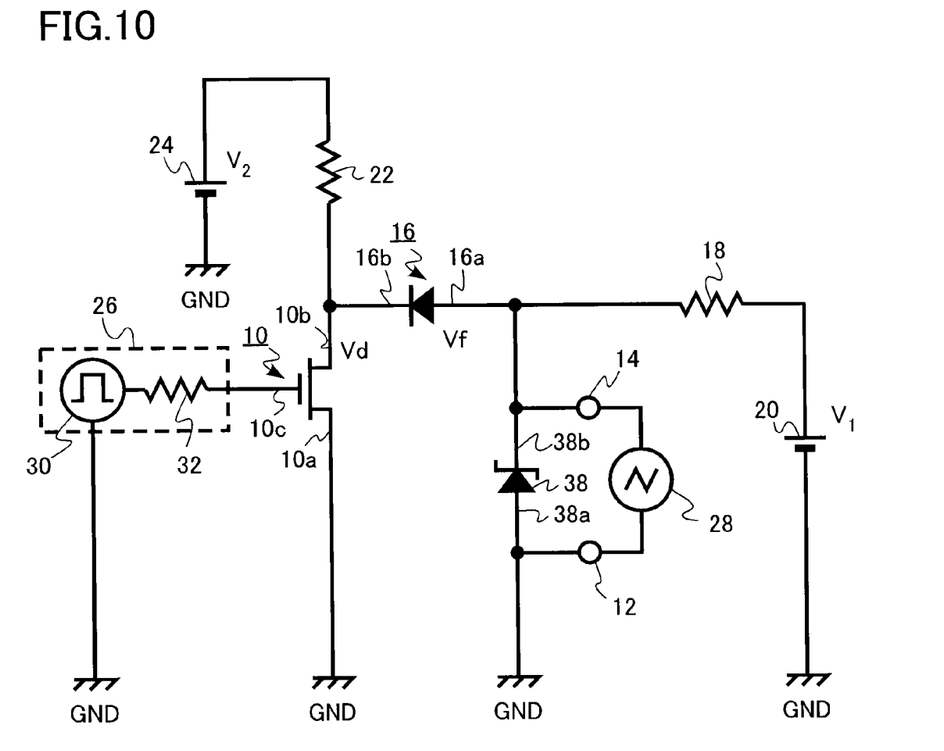
FIG. 10 is a circuit diagram of the semiconductor inspection apparatus according to a third embodiment.

FIG. 10 is a circuit diagram of the semiconductor inspection apparatus according to the present embodiment. The semiconductor inspection apparatus according to the present embodiment includes a second diode 38. The second diode 38 is a Zener diode.

For example, when the HEMT 10 is continuously switched and then the HEMT 10 is off, the drain voltage Vd increases to the test voltage $V_2$. At that time, the voltage of a second detecting unit 14 increases to a high voltage due to the parasitic capacitance of the first diode 16. This may unfortunately cause unstable operation of the semiconductor inspection apparatus.

When a constant voltage (Zener voltage) is applied in a reverse direction, a current flows in the reverse direction in the Zener diode due to Avalanche breakdown. Thus, using a Zener diode as the second diode 38 can prevent the voltage of the second detecting unit 14 from increasing to the Zener voltage or more. This can achieve stable operation of the semiconductor inspection apparatus.

For example, the Zener voltage is set at a higher voltage than a first voltage $V_1$ by between 1 and 5 V.

As described above, the present embodiment can provide a semiconductor inspection apparatus that can evaluate the current collapse from a shorter period of time after the switching. Furthermore, stable operation of the semiconductor inspection apparatus can be achieved.

Fourth Embodiment

The semiconductor inspection apparatus according to the present embodiment is similar to the semiconductor inspection apparatus of the third embodiment except for further including a first capacitor electrically connected in parallel with a first diode and a second capacitor electrically connected in parallel with a second diode. Thus, the descriptions of the contents overlapping with the third embodiment may be omitted.

Figure 11:
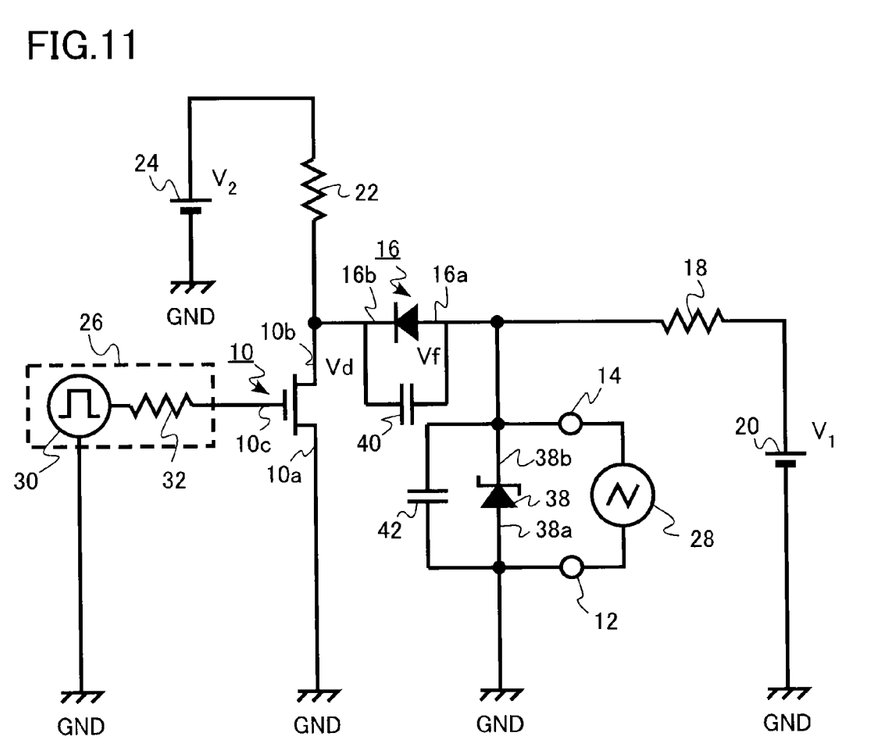
FIG. 11 is a circuit diagram of the semiconductor inspection apparatus according to a fourth embodiment.

FIG. 11 is a circuit diagram of the semiconductor inspection apparatus according to the present embodiment. The semiconductor inspection apparatus according to the present embodiment includes a first capacitor 40 electrically connected to a first diode 16 in parallel and a second capacitor 42 electrically connected to a second diode 38 in parallel.

According to the present embodiment, adjusting the capacitance of the first capacitor 40 and the capacitance of the second capacitor 42 can further prevent the detection voltage from dropping toward a negative value just after the switching of the HEMT 10. Thus, the variation in drain voltage Vd can be observed from an even shorter period of time after the switching.

As described above, the present embodiment can provide a semiconductor inspection apparatus that can evaluate the current collapse from an even shorter period of time after the switching.

Note that adding only one of the first capacitor 40 and the second capacitor 42 and regulating the capacitance can also reduce the drop of the detection voltage toward a negative value just after the switching of the HEMT 10.

Fifth Embodiment

Differently from the third embodiment, the semiconductor inspection apparatus according to the present embodiment includes an inductive load on the side of a drain electrode. The descriptions of the contents overlapping with the third embodiment may be omitted.

Figure 12:
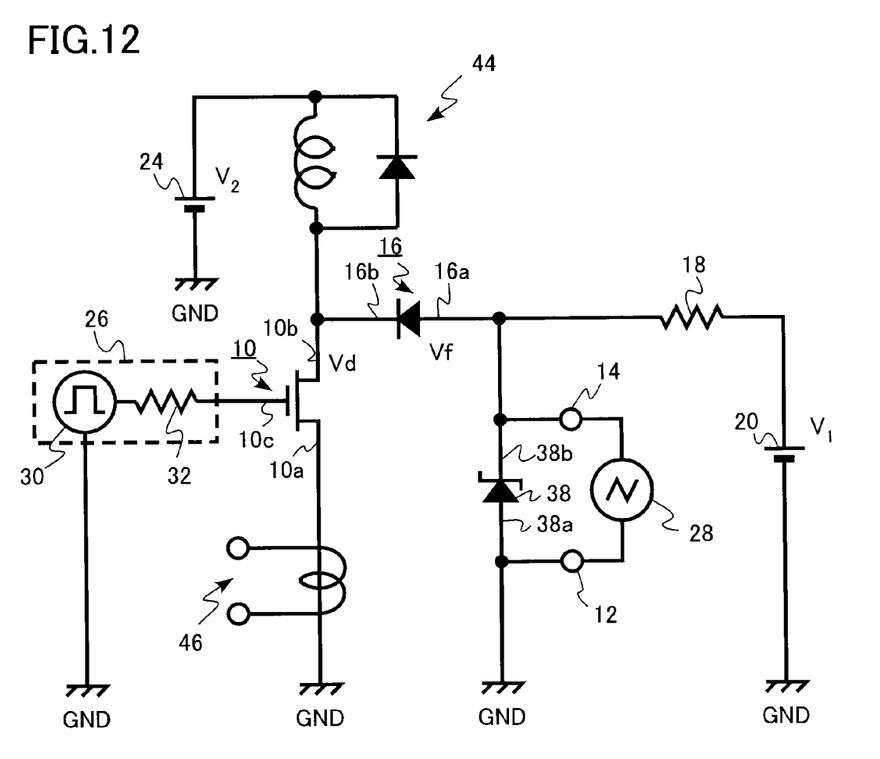
FIG. 12 is a circuit diagram of the semiconductor inspection apparatus according to a fifth embodiment.

FIG. 12 is a circuit diagram of the semiconductor inspection apparatus according to the present embodiment. The semiconductor inspection apparatus according to the present embodiment includes an inductive load 44 working as a load and formed by a coil and a diode electrically connected to each other in parallel on the side of a drain electrode 10b. A current probe 46 is connected between a source electrode 10a and a ground potential.

According to the present embodiment, using the inductive load 44 as a load can evaluate current collapse in a double pulse test approximate to practical conditions.

The HEMT of a GaN based semiconductor has been described above as an exemplary field effect transistor in the embodiments. The embodiments, however, can be applied to field effect transistors other than the HEMT to evaluate the variation in on-resistance just after the field effect transistor is switched.

While certain embodiments have been described, these embodiments have been presented by way of example only, and are not intended to limit the scope of the inventions. Indeed, the semiconductor device inspection apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor inspection apparatus comprising:
   a first detecting unit capable of being electrically connected to a source electrode of a field effect transistor to be evaluated, the first detecting unit used for detecting voltage;
   a first diode including a first anode electrode and a first cathode electrode, the first cathode electrode capable of being electrically connected to a drain electrode of the field effect transistor;
   a second detecting unit electrically connected to the first anode electrode, the second detecting unit used for detecting voltage;
   a first resistance element of which a first end is electrically connected to the first anode electrode; and
   a first electric power source electrically connected to a second end of the first resistance element.

2. The apparatus according to claim 1, wherein a breakdown voltage of the first diode is higher than a drain voltage to be applied to the drain electrode.

3. The apparatus according to claim 1, wherein a relationship of $R_1 \geq 10V_1/Id$ is satisfied, where $R_1$ is a resistance value of the first resistance element, $V_1$ is a voltage of the first electric power source and Id is a drain current of the field effect transistor.

4. The apparatus according to claim 1, further comprising:
   a second diode including a second anode electrode and a second cathode electrode, the second anode electrode electrically connected to the first detecting unit, the second cathode electrode electrically connected to the second detecting unit.

5. The apparatus according to claim 4, wherein the second diode is a Zener diode.

6. The apparatus according to claim 1, further comprising:
   a second resistance element of which a first end is capable of being electrically connected to the drain electrode; and
   a second electric power source electrically connected to a second end of the second resistance element, the second electric power source applying a voltage higher than a voltage of the first electric power source.

7. The apparatus according to claim 1, wherein the first diode is a fast recovery diode.

8. The apparatus according to claim 1, wherein the first diode is a Schottky barrier diode including SiC.

9. The apparatus according to claim 4, further comprising:
   a first capacitor electrically connected in parallel with the first diode; and
   a second capacitor electrically connected in parallel with the second diode.

10. The apparatus according to claim 1, further comprising:
    a gate drive circuit capable of being electrically connected to a gate electrode of the field effect transistor.

11. The apparatus according to claim 1, further comprising:
    a measuring instrument electrically connected to the first detecting unit and the second detecting unit, the measuring instrument measuring a voltage between the first detecting unit and the second detecting unit.

12. The apparatus according to claim 1, wherein the field effect transistor is an HEMT of a GaN based semiconductor.

* * * * *